United States Patent
Chiu et al.

(10) Patent No.: US 7,620,140 B2
(45) Date of Patent: Nov. 17, 2009

(54) PROGRAMMABLE INTEGER AND FRACTIONAL FREQUENCY DIVIDER

(75) Inventors: Huan-Ke Chiu, Hsinchu County (TW); Yeong-Lin Yu, Kaohsiung (TW); Tzu-Yi Yang, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/354,719

(22) Filed: Jan. 15, 2009

(65) Prior Publication Data
US 2009/0168947 A1 Jul. 2, 2009

Related U.S. Application Data

(62) Division of application No. 11/967,173, filed on Dec. 29, 2007, now Pat. No. 7,551,707.

(30) Foreign Application Priority Data
May 16, 2007 (TW) ............................. 96117362 A

(51) Int. Cl.
*H03K 21/00* (2006.01)
*H03K 23/00* (2006.01)
(52) U.S. Cl. .......................................... 377/47; 377/48
(58) Field of Classification Search .................. None
See application file for complete search history.

(56) References Cited

U.S. PATENT DOCUMENTS

| 6,668,035 | B2 * | 12/2003 | Han et al. ....................... 377/48 |
| 2003/0198311 | A1 * | 10/2003 | Song et al. .................. 375/376 |
| 2004/0165691 | A1 * | 8/2004 | Rana ........................... 377/48 |
| 2007/0160179 | A1 * | 7/2007 | Narathong et al. ............ 377/47 |

* cited by examiner

*Primary Examiner*—Tuan Lam
(74) *Attorney, Agent, or Firm*—Quintero Law Office

(57) ABSTRACT

A programmable integer and fractional frequency divider is provided. The programmable divider divides a frequency of an input signal by a first divisor to generate an output signal, and comprises a programmable integer frequency divider and a fractional number switch. The programmable integer frequency divider divides the frequency of the input signal by a second divisor to generate the output signal, wherein the second divisor is first or second integers depending on a divisor switching signal. The fractional number switch calculates a pulse count of the output signal, and generates the divisor switching signal to switch from the first to the second integer when the pulse count of the output signal equals to a predetermined pulse count determined by a fractional part of the first divisor, and receives a fractional divisor control signal to change the predetermined pulse count, thereby changing the fractional part of the first divisor.

7 Claims, 9 Drawing Sheets

PROGRAMMABLE INTEGER AND FRACTIONAL FREQUENCY DIVIDER

This application is a divisional of U.S. application Ser. No. 11/967,173, filed Dec. 29, 2007 now U.S. Pat. No. 7,551,707, the entire disclosure of which is hereby incorporated by reference.

BACKGROUND OF THE INVENTION

1. Field of the Invention

The invention relates to programmable frequency dividers, and in particular to programmable integer and fractional frequency dividers.

2. Description of the Related Art

Conventionally, a device performing frequency division of a high frequency signal, dividing a high input frequency to a desirable output frequency, is known as a programmable frequency divider or direct programmable frequency divider.

At present, programmable frequency dividers are accomplished by two approaches. The first approach is a frequency divider with a pulse/swallow counter. The frequency divider utilizes a dual-modulus divider, a programmable counter, and a swallow counter to provide the functionality of integer programmable frequency divider. The advantage is that the circuit design is adaptive to operational division range. The disadvantages are that only integer division is allowable, and that the dual-modulus divider is used in multi-mode or multi-band, thus, dissipating much power, and resulting in the frequency divider being unable to provide optimal power distribution to the three utilized circuits under a fixed method.

The second approach utilizes a multi-mode fractional frequency divider, for example, a divide-by-2/2.5/3/3.5 cell, coupled to a zipper frequency divider. The multi-mode frequency divider uses a state machine to control phase switching to provide divisors. The zipper frequency divider comprises multiple dual-modulus division cells coupled in series, each a divide-by-2/3 cell. The advantage is that the frequency divider is capable of fractional division. However, high frequency circuit design remains a challenge owing to the state machine utilized in the multi-modulus divider. The state machine utilized in the multi-modulus divider and other circuits are designed according to the fractions in uses, thus, the fraction choices are limited. Further, since the minimal divisor for the zipper frequency divider is $2^N$, N is the number of dual-modulus dividing cells, the divisors in the programmable frequency divider are limited, leading to a requirement of more dual-modulus dividing cells for the operational divisor range.

BRIEF SUMMARY OF THE INVENTION

A detailed description is given in the following embodiments with reference to the accompanying drawings.

According to an embodiment of the invention, a programmable integer and fractional frequency divider is disclosed, dividing a frequency of an input signal by a first divisor to generate an output signal, wherein the first divisor is an integer or a fraction, and the programmable integer and fractional frequency divider comprises a programmable integer frequency divider and a fractional number switch. The programmable integer frequency divider divides the frequency of the input signal by a second divisor to generate the output signal, wherein the second divisor is set to be first or second integers according to a divisor switching signal. The fractional number switch, calculates a pulse count of the output signal, and generates the divisor switching signal to switch from the first integer to the second integer when the pulse count of the output signal equals to a predetermined pulse count, wherein the predetermined pulse count is determined by a fractional part of the first divisor, and the fractional number switch receives at least a fractional divisor control signal to change the predetermined pulse count, thereby changing the fractional part of the first divisor.

Also provided is a programmable integer and fractional frequency divider, dividing a frequency of an input signal by a first divisor to generate an output signal, wherein the first divisor is an integer or a fraction. The programmable integer and fractional frequency divider comprises a dual-modulus divider, a programmable counter, a swallow counter and fractional number switch. The dual-modulus divider divides the frequency of the output signal by a second divisor, wherein the second divisor is first or second integers according to a divisor switching signal. The programmable counter calculates a pulse count of the output signal of the dual-modulus divider, and generates the output signal when the pulse count equals to a third integer. The swallow counter, calculates the pulse count of the output signal of the dual-modulus divider, switches a mode signal to a second level when the output signal equals to a fourth integer, and resets the mode signal to a first level when the output signal is a predetermined level. The fractional number switch calculates a pulse count of the mode signal of the swallow counter, generates the divisor switching signal to switch a divisor of the dual-modulus divider when the pulse count of the mode signal equals to a predetermined pulse count, wherein the predetermined pulse count is determined by a fractional part of the first divisor, and the fractional number switch receives at least one fractional divisor control signal to change the predetermined pulse count, thereby changing the fractional part of the first divider.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
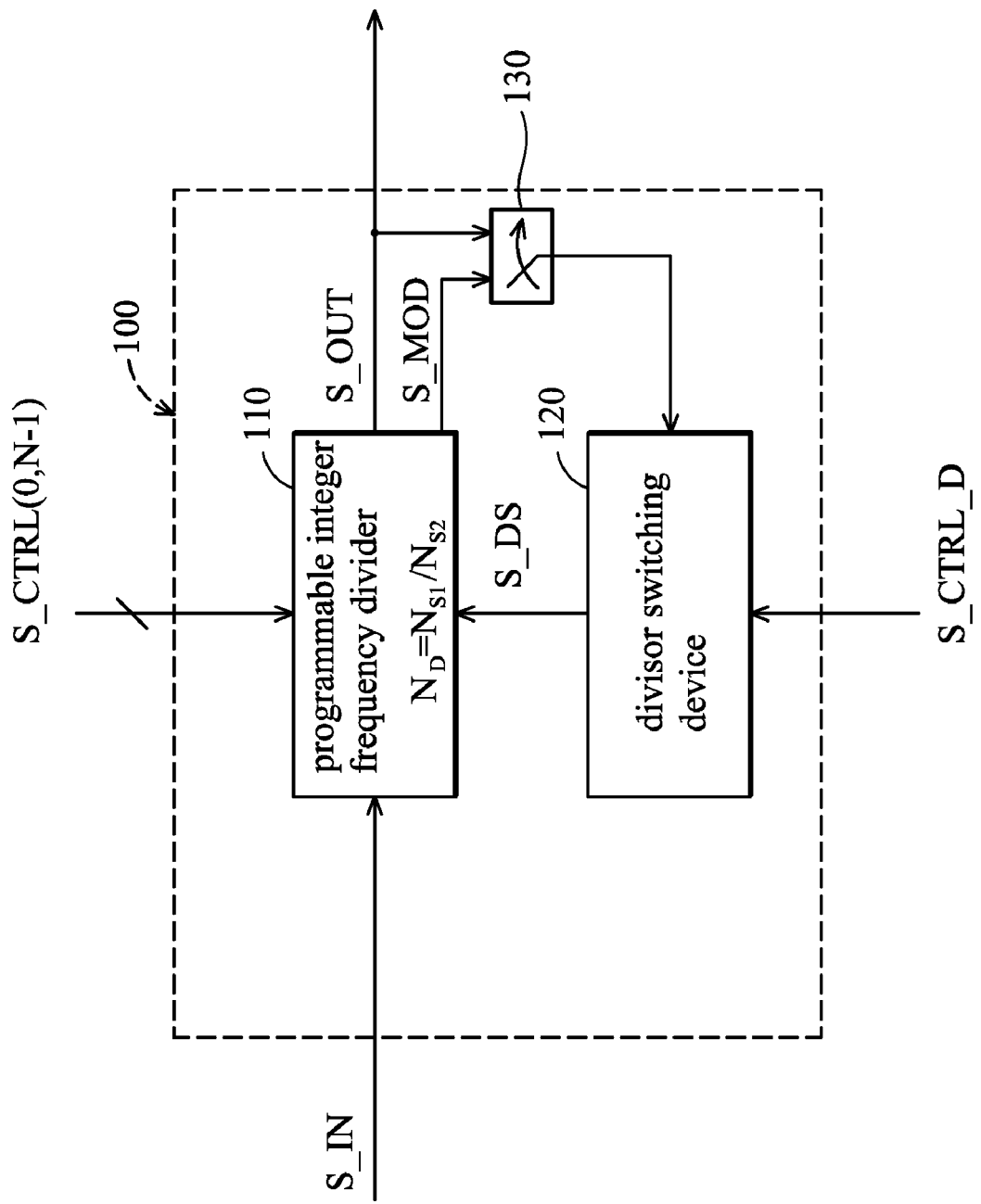
FIG. 1 is a block diagram for an exemplary programmable integer and fraction frequency divider according to the invention.

FIG. 1 is a block diagram for an exemplary programmable integer and fraction frequency divider 100 according to the invention. The programmable integer and fraction frequency divider 100 divides input frequency $f_{IN}$ by Z to produce $f_{OUT}=f_{IN}/Z$, wherein divisor Z is an arbitrary integer or a fractional number.

Typically, the minimal value of the fractional number of the frequency divider is determined by a preceding circuit (not shown) providing input frequency $f_{IN}$. For example, when the preceding circuit comprises a frequency divider dividing a higher output frequency by predetermined divisor $N_P$ to generate input frequency $f_{IN}$, the minimal value of the fractional number is selected as $1/N_P$ to reduce phase noise effect. For example, when predetermined divisor $N_P$ is 2 or 4, the minimal value of the fractional number is 0.5 or 0.25. In most frequency divider applications, output frequency $f_{OUT}$ is provided, so that integer N is determined by input frequency $f_{IN}$, and $f_{IN}/Z=f_{OUT}$.

As shown in FIG. 1, programmable integer and fraction frequency divider 100 comprises programmable integer frequency divider 110, switch 130, and fractional number switch 120 coupled to programmable integer frequency divider 110. Programmable integer frequency divider 110 is coupled to switch 130.

Divisor $N_D$ of the programmable integer frequency divider 110 is determined by first integer $N_{S1}$ and second integer $N_{S2}$, wherein at least one is set to be divisor $N_D$ by default. Programmable integer frequency divider 110 receives input signal S_IN having input frequency $f_{IN}$, divides input frequency $f_{IN}$ by divisor $N_D$, and outputs output signal S_OUT having $f_{OUT}=f_{IN}/N_D$. While performing the division, programmable integer frequency divider 110 also receives at least one divisor switching signal from fractional number switch 120, e.g., divisor switching signal S_DS in FIG. 1, and determines switching divisor $N_D$ according to divisor switching signal S_DS. In one embodiment, divisor switching signal S_DS may be a first level or a second level, and programmable integer frequency divider 110 may set divisor $N_D$ to be integers $N_{S1}$ and $N_{S2}$, accordingly.

Please note that, in one embodiment, divisor switching signal S_DS of programmable integer frequency divider 110 is only determined by the divisor switching signal of fractional number switch 120.

Switch 130 controls the connection between programmable integer frequency divider 110 and fractional number switch 120. When using zipper architecture, switch 130 switches to output signal S_OUT, when using pulse/swallow counter architecture, switch 130 switches to mode signal S_MOD.

Fractional number switch 120 receives mode signal S_MOD and output signal S_OUT, calculates the pulse count in output signal S_OUT, and generates divisor switching signal S_DS according to the pulse count and mode signal S_MOD. In one embodiment, divisor switching signal S_DS is set as the first level in advance to set divisor $N_D$ by $N_{S1}$. When the pulse count of output signal S_OUT equals to a predetermined pulse count ($N_P-1$), fractional number switch 120 switches divisor switching signal S_DS from the first to the second levels, so that divisor $N_D$ can switch from integers $N_{S1}$ to $N_{S2}$. Using the pulse count of output signal S_OUT, the level of divisor switching signal S_DS returns to the first level to keep divisor $N_D$ at integer $N_{S1}$. As indicated in FIG. 1, fractional number switch 120 receives fractional divisor control signal S_CTRL_D generated by an external circuit (not shown) to control predetermined divisor $N_P$, thereby controlling the minimal value of the fraction number. The advantage of this approach is by properly designing programmable integer frequency divider 110, any fractional divisor may be obtained through controlling predetermined divisor $N_P$.

The time for divisor Z and divisor switching signal S_DS remaining at the second level, i.e., the pulse width of divisor switching signal S_DS, is determined by predetermined divisor $N_P$, integers $N_{S1}$ and $N_{S2}$. Assuming divisor $N_D$ has a predetermined value $N_{S1}$ and the pulse width of divisor switching signal S_DS is that of output signal S_OUT, input signal S_IN must be $N_P Z$ pulses for programmable integer and fraction frequency divider 100 to generate $N_P$ pulses in output signal S_OUT. During $N_P Z$ pulse generation, input signal S_IN is divided by integer $N_{S1}$ during the first ($N_P-1$) pulses, and then divided by $N_{S2}$ during the last pulse. Thus $N_P \times Z = N_{S1} \times (N_P-1) + N_{S2} \times 1$, and $Z = N_{S1} \times (N_P-1)/N_P + N_{S2}/N_P$. Similarly, when the pulse width of divisor switching signal S_DS is $\times$ times that of output signal S_OUT, divisor $Z = [N_{S1} \times (N_P-1)/N_P + N_{S2}/N_P] \times X$.

Figure 2:
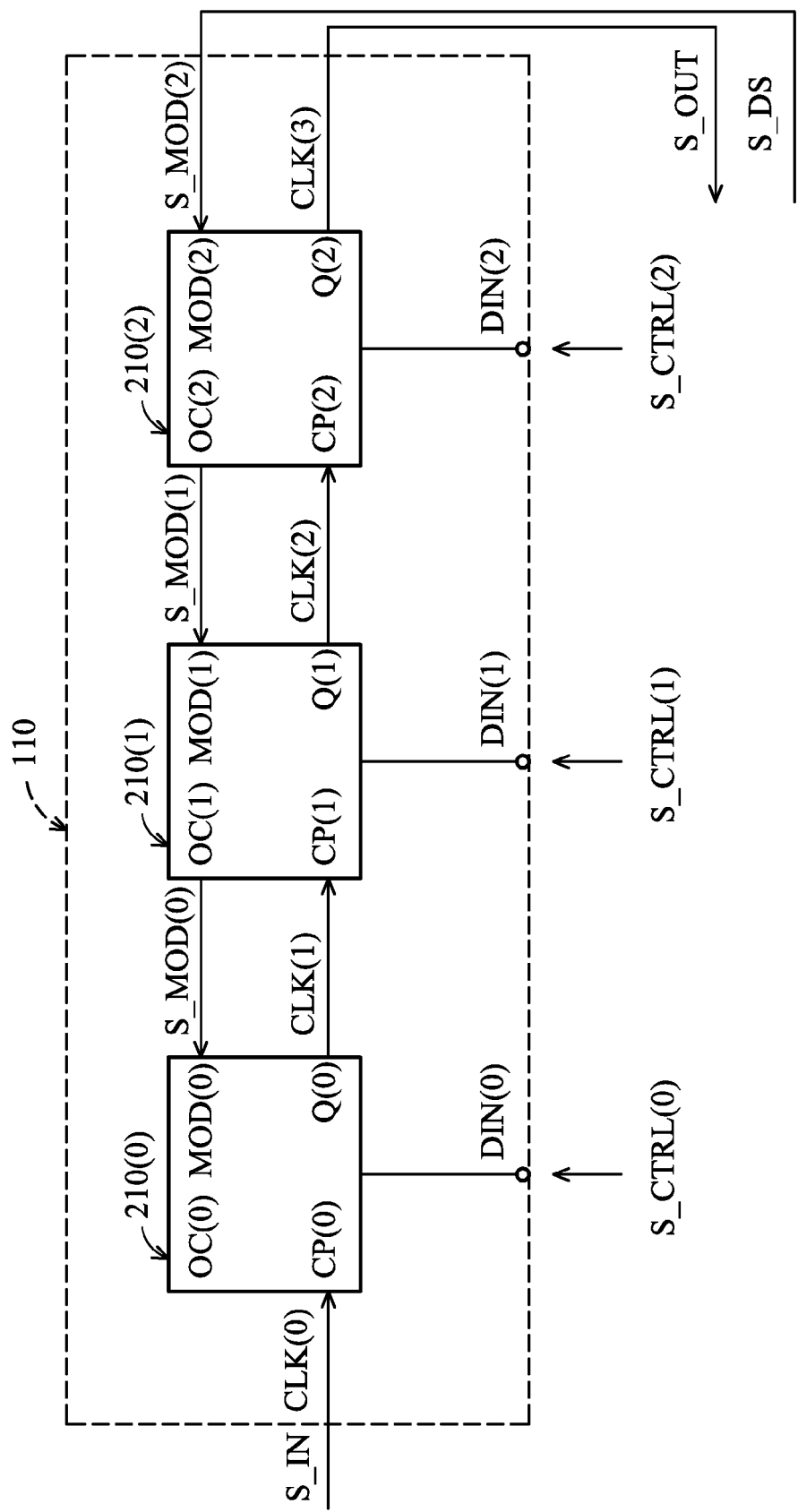
FIG. 2 is an exemplary circuit diagram of a programmable integer frequency divider 110 in FIG. 1.

FIG. 2 is an exemplary circuit diagram of a programmable integer frequency divider 110 in FIG. 1. As shown in FIG. 2, programmable integer frequency divider 110 is a zipper divider comprising N (N=3 in the embodiment) programmable dual-modulus dividing cells 210(0) to 210(2) coupled in series.

Each dual-modulus dividing cell 210(k) comprises a clock input terminal CP(k) for receiving signal CLK(k), a mode input MOD(k) for receiving S_MOD(k), a clock output Q(k) for outputting signal CLK(k+1), and mode output OC(k) coupled to each other as indicated in FIG. 2. Each dual-modulus dividing cell 210(k) also comprises divisor control terminal DIN(k) coupled to divisor control signal S_CTRL(k) provided by an external circuit (not shown). Input signal S_IN is provided to clock input terminal CP(0) of dual-modulus dividing cell 210(0) for signal CLK (0), and CLK(N) of clock output Q(N-1) of the last dual-modulus dividing cell 210(N-1) is the output signal S_OUT of programmable integer frequency divider 110. Divisor switching signal S_DS generated by fractional number switch 120 is mode signal S_MOD(N-1) of the last dual-modulus dividing cell 210(N-1).

The divisor of each dual-modulus dividing cells 210(k), defined by frequency of signal CLK(k+1)/frequency of signal CLK(k), is 2 or 3, and divisor $N_D$ of programmable integer frequency divider 110 can be represented by:

$$N_D = 2^N + (D_{N-1} \times 2^{N-1} + \ldots + D_1 \times 2^1 + D_0 \times 2^0)$$

Where divisor coefficient $D_k$ is 0 or 1, determined by divisor control signal S_CTRL(k) received by divisor control terminal DIN(k) and mode signal S_MOD(k).

While the divisor of each dual-modulus dividing cell can be changed to 2 or 3 in the embodiment, N1 and (N1+1) can also be used for the divisors. N1 is not limited at 2, and those with ordinary skill in the art can make appropriate modifications. Divisor Z of programmable integer frequency divider 110 can be represented by:

$$N_D = N1^N + (D_{N-1} \times 2^{N-1} + \ldots + D_1 \times 2^1 + D_0 \times 2^0)$$

Referring to FIG. 1, to ensure the continuous rage of all integers, the mode I/O control terminal of the dual-modulus dividing cell is coupled to logical circuits with appropriate modifications. The disclosures of a zipper divider can be found in U.S. Pat. No. 5,065,415, U.S. Pat. No. 6,281,721, "A low-power truly-modular 1.8 GHz programmable divider in standard CMOS technology" by C. Vaucher and Z. Wang in ESSCIRC'99. pp. 406~409, 1999, and "A family of low-power truly modular programmable dividers in standard 0.35-mm CMOS technology" by C. Vaucher, I. Ferencic, M. Locher, S. Sedvallson, U. Voegeli, and Z. Wang in IEEE J. Solid-State Circuits SC-35, No. 7, pp. 1039~1045, 2000, respectively.

When divisor switching signal S_DS is the first level (high level) or the second level (low level), the divisor of programmable integer frequency divider 110 is $N_{D1}=N1^N$ or $N_{D2}=N1^N+(D_{N-1} \times 2^{N-1}+ \ldots +D_1 \times 2^1+D_0 \times 2^0)$. Thus fractional number switch 120 sets the fractional number as $1/N_P$, so that when the pulse width of divisor switching signal S_DS equals to that of output signal S_OUT, divisor Z is $N_{D1} \times (N_P-1)/N_P+N_{D2}/N_P=N1^N+(D_{N1} \times 2^{N-1}+ \ldots +D_1 \times 2^1+D_0 \times 2^0)/N_P$.

Note programmable integer frequency divider 110 in FIG. 1 may comprise at least one frequency divider coupled in series, so long as at least one of the frequency dividers is a programmable integer frequency divider controlled by the fractional number switch for changing the divisor.

Figure 3:
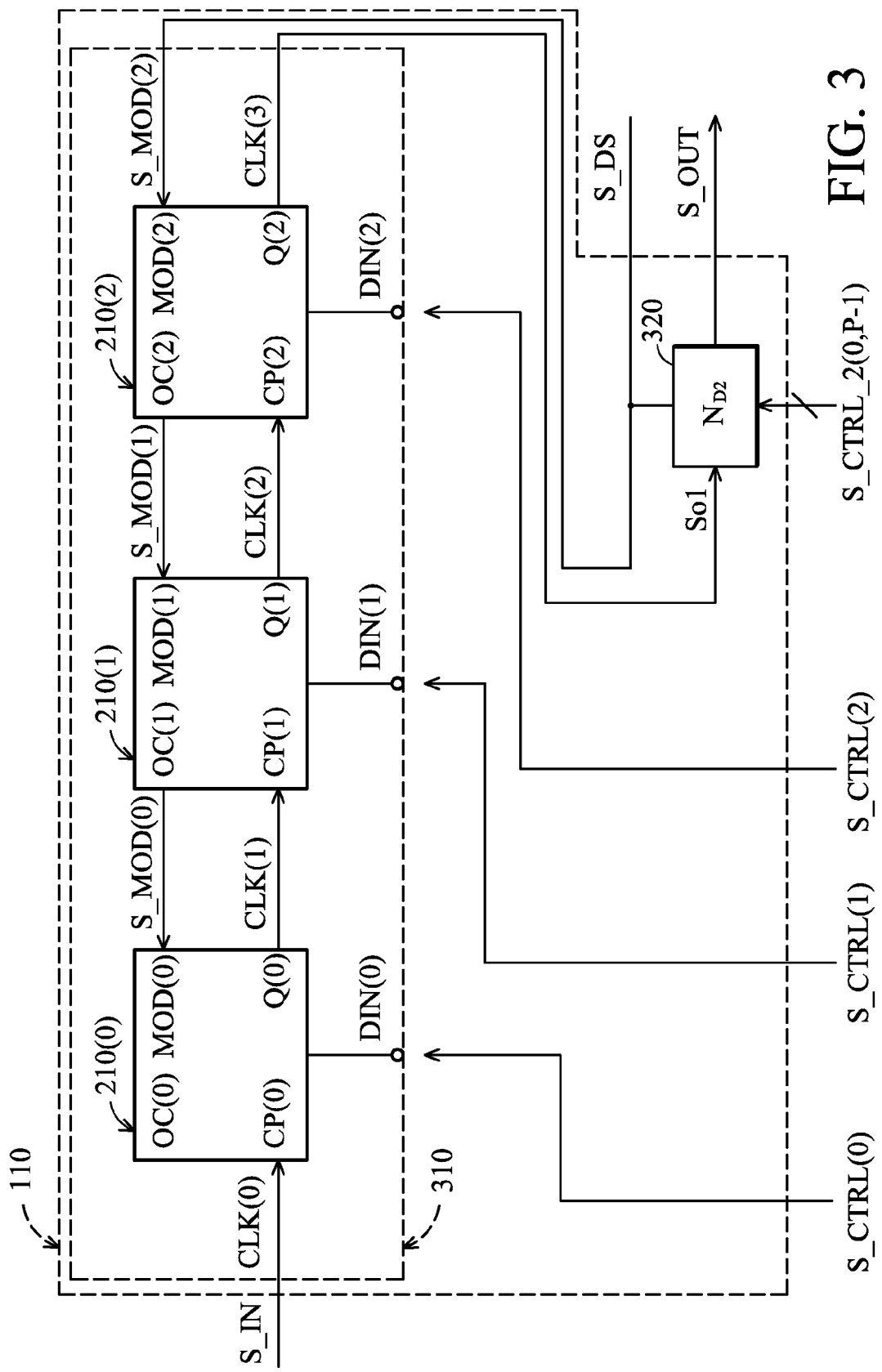
FIG. 3 is another exemplary circuit diagram of a programmable integer frequency divider 110 in FIG. 1.

FIG. 3 is another exemplary circuit diagram of a programmable integer frequency divider 110 in FIG. 1. As shown in FIG. 3, programmable integer frequency divider 110 comprises zipper frequency divider 310 and integer frequency divider 320. In comparison with FIG. 2, integer frequency divider 320 is added between the zipper divider (zipper frequency divider 310 in FIG. 3) and fractional number switch 120. The circuit components identical to FIG. 2 which have already been explained will not be repeated for brevity.

Integer frequency divider 320 receives output signal So1 of zipper frequency divider 310, i.e., signal CLK(N) generated at clock output Q(N−1), divides signal CLK(N) by divisor $N_{D2}$ to generate output signal S_OUT.

When divisor switching signal S_DS is the first level (high level) or the second level (low level), the overall divisor of zipper frequency divider 310 and integer frequency divider 320 is $N_{S1}=N1^N \times N_{D2}$ or $N_{S2}=N1^N \times N_{D2}+(2^{N-1} \times DS_{N-1} 2^{N-2} \times DS_{N-2}+ \ldots +2^0 \times DS_0)$. Therefore when fractional number switch 120 sets its fractional number as $1/N_P$, the pulse width of divisor switching signal S_DS equals to that of output signal S_OUT, $Z=N_{S1} \times (N_P-1)/N_P+N_{S2}/N_P=N_{S1}+(2^0 \times DS_0+2^1 \times DS_1+ \ldots +2^{N-1} \times DS_{N-1})/N_P$, where $DS_0$ to $DS_{N-1}$ are determined by the levels of divisor control signals S_CTRL (0) to S_CTRL(N−1).

Generally speaking, when utilizing programmable integer frequency divider 110 in the embodiment, divisor Z of programmable integer and fractional frequency divider is represented by:

$$Z=N1^N \times N_{D2}+2^{-M} \times DZ_0+2^{-(M-1)} \times DZ_1+ \ldots +2^{N-M-2} \times DZ_{N-2}+2^{N-M-1} \times DZ_{N-1}$$

The difference between FIG. 3 and FIG. 2 is that the start integer is $N1^N \times N_{D2}$ instead of $N1^N$. In order to obtain divisor Z, the predetermined divisor $N_P$ and signal levels of $DZ_0$ to $DZ_{N-1}$ are required, where $DZ_0$ to $DZ_{N-1}$ are determined by S_CTRL(0) to S_CTRL(N−1).

While the pulse count calculated by fractional number switch 120 in FIG. 3 is $1/N_{D2}$ times that of in FIG. 2, the pulse width of divisor switching signal S_DS in FIG. 3 is $N_{D2}$ times that of in FIG. 2, thus after compensation, the predetermine pulse count for FIGS. 2 and 3 are both $N_P=2^M/X$.

For example, the divisor is set as Z=26.5 for a level 3 (N=3 and N1=2) dual-modulus dividing cell 210. Since $Z=2^3 \times 3+(2^{-1}) \times 1+(2^0) \times 0+(2^1) \times 1$ (M=1 and X=1), $N_{D2}$ is set to 3, $DZ_0$ to $DZ_{N-1}$ are set to 1, 0, 1 respectively. Similarly, divisor control signals S_CTRL (0) to S_CTRL(2) are the first level (high level), the second level (low level), the first level (high level), and $N_P=2$.

Integer frequency divider 320 may also be a programmable frequency divider, receiving at least one second divisor control signal, e.g., S_CTRL_2(0) to S_CTRL_2(P−1) in FIG. 3, to change $N_{D2}$. In doing so, the lower limit of the divisor range of programmable integer and fraction frequency divider 100 is $2^N \times N_{D2}$, not limited to the base of 2. As a result, fewer cells of zipper dividers (smaller N) can accomplish larger divisor Z.

Figure 4:
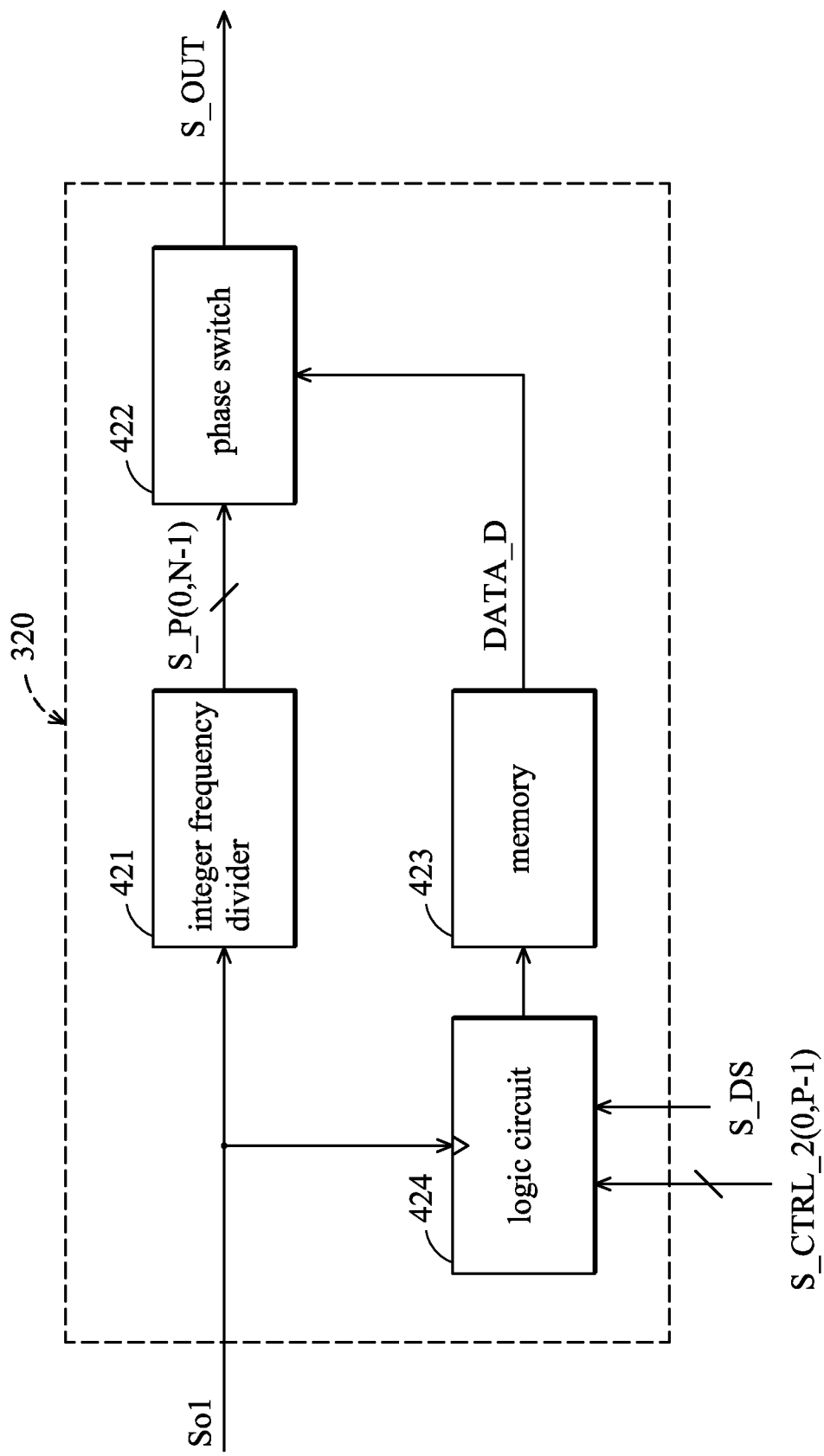
FIG. 4 is a block diagram of an exemplary programmable frequency divider.

FIG. 4 is a block diagram of an exemplary programmable frequency divider, as a modification of integer frequency divider 320 in FIG. 3. As shown in FIG. 4, integer frequency divider 320 is a multi-modulus dividing cell comprising integer frequency divider 421, phase switch 422, embedded memory 423, and logic circuit 424.

Integer frequency divider 421 receives the output of zipper frequency divider 310, and divides the output by integer N, e.g., 2, to provide signals S_P(0) to S_P(N−1) with different phases, e.g., 0° or 180°, to a phase input terminal of phase switch 422. Embedded memory 423 stores at least 2 sets of phase conversion data DATA_D of the divisors, corresponding to different integer divisor $N_{D2}$. Logic circuit 424 receives at least one second divisor control signal, e.g., S_CTRL_2(0) to S_CTRL_2(P−1) in the diagram and divisor switching signal S_DS, and generates the address of embedded memory 423 by the second divisor control signals S_CTRL_2(0) to S_CTRL_2(P−1) and divisor switching signal S_DS, instructs embedded memory 423 to provide phase conversion data DATA_D to the phase control terminal of phase switch 422. Phase switch 422 sequentially determines an output signal as one in signals S_P(0) to S_P(N−1) according to phase conversion data DATA_D of each bit. Each phase conversion data DATA_D represents the divisor, providing integer frequency divider 320 with different divisor $N_D$, e.g., 3, 4, 5, and 6. Memory 423 may be an embedded memory, phase conversion data DATA_D may be changed anytime after IC manufacturing, thereby changing the divisor range of programmable integer frequency divider 110.

Please note that the divisor switching signal generated by dual-modulus dividing cell 210 not only can couple to a single programmable frequency divider, but can also couple to more than one programmable frequency dividers.

Figure 5:
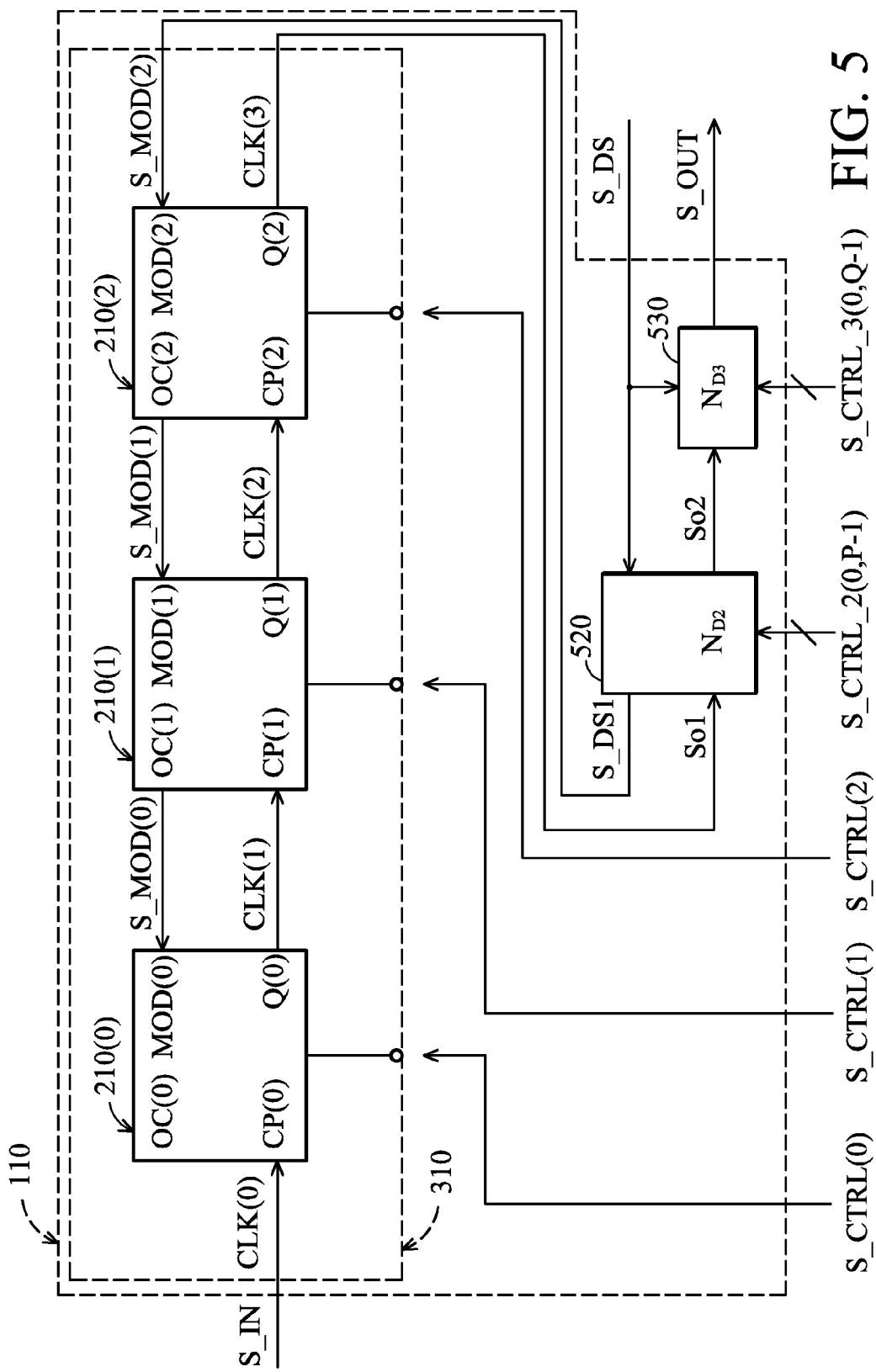
FIG. 5 is a block diagram of an exemplary programmable integer frequency divider 110 in FIG. 1.

FIG. 5 is a block diagram of an exemplary programmable integer frequency divider 110 in FIG. 1. In comparison to FIG. 3, the only difference is that zipper frequency divider 310 in programmable integer frequency divider 110 is coupled to two integer frequency division cells 520 and 530, and divisor switching signal S_DS is coupled to two integer frequency dividers 520 and 530.

Integer frequency divider 520 is coupled to output signal So1 generated by zipper frequency divider 310, than divides the frequency of output signal So1 by integer divisor $N_{D2}$ to generate the second output signal So2. Further, integer frequency divider 520 utilizes divisor switching signal S_DS to change integer divisor $N_{D2}$. Similarly, integer frequency divider 530 receives the second output signal So2 generated by integer frequency divider 520, and divides the second output signal So2 by integer divisor $N_{D3}$ to generate output signal S_OUT.

Integer frequency divider 520 may be a multi-mode programmable frequency divider receiving divisor switching signal S_DS and the second divisor control signals, e.g., S_CTRL_2(0) to S_CTRL_2(P−1) to change integer divisor $N_{D2}$. Further, integer frequency divider 530 may also be a multi-mode programmable frequency divider receiving at least one third divisor control signals, e.g., S_CTRL_3(0) to S_CTRL_3(Q−1) to change integer divisor $N_{D3}$.

In one embodiment, when divisor switching signal S_DS is the first or the second level, accordingly, integer divisor $N_{D2}$ of integer frequency divider 520 is $N_{D21}$ or $N_{D22}$, and integer divisor $N_{D3}$ of integer frequency divider 530 is $N_{D31}$ or $N_{D32}$. When divisor switching signal S_DS is the first level (high level), the overall divisor of zipper frequency divider 310, integer frequency dividers 520 and 530 is $N_{S1}=N1^N \times N_{D21} \times N_{D31}$. When divisor switching signal S_DS is the second level (low level), the overall divisor of zipper frequency divider 310, integer frequency dividers 520 and 530 is $N_{S2}=N1^N \times N_{D21} \times N_{D31}+(2^{N+P+Q-1} \times DS_{N+P+Q-1}+2^{N+P+Q-2} \times DS_{N+P+Q-2}+ \ldots +2^0 \times DS_0)$.

Thus, when fractional number switch 120 sets the fractional number to be $1/N_P$, and the pulse width of divisor switching signal S_DS equals to that of output signal S_OUT, $Z=N_{S1}\times(N_P-1)/N_P+N_{S2}/N_P=N1^N \times N_{D21} \times N_{D31}+(2^{N+P+Q-1} \times DS_{N+P+Q-1}+2^{N+P+Q-2} \times DS_{N+P+Q-2}+ \ldots +2^0 \times DS_0)/N_P$, where $DS_0$ to $DS_{N+P+Q-1}$ are determined by S_CTRL(0) to S_CTRL(N−1), S_CTRL_2(0) to S_CTRL_2(P−1), and S_CTRL_3(0) to S_CTRL_3(Q−1).

Generally speaking, if $N_P=2^M$, by utilizing programmable integer frequency divider 110 in the embodiment, divisor Z of the programmable integer and fractional frequency divider is represented by:

$$Z=N1^N \times N_{D21} \times N_{D31}+2^{-M} \times DZ_0+2^{-(M-1)} \times DZ_1+\ldots+2^{N+P+Q-M-2} \times DZ_{N+P+Q-2}+2^{N+P+Q-M-1} \times DZ_{N+P+Q-1}$$

The difference between FIG. 5 and FIG. 3 is that the start integer is changed from $N1^N$ to $N1^N \times N_{D21} \times N_{D31}$. In order to obtain divisor Z, the predetermined divisor $N_P$ and signal levels of $DZ_0$ to $DZ_{N+P+Q-1}$ are required, where $DZ_0$ to $DZ_{N+P+Q-1}$ are determined by S_CTRL(0) to S_CTRL(N−1), S_CTRL_2(0) to S_CTRL_2(P−1), and S_CTRL_3(0) to S_CTRL_3(Q−1).

In a similar way, the zipper divider can couple to any number of integer frequency dividers, wherein divisor switching signal S_DS controls the divisors of any number of the integer frequency dividers.

FIG. 4 is a block diagram of integer frequency dividers 520 or 530. As shown in FIG. 4, the difference between integer frequency divider 520 and integer frequency divider 320 is that for integer frequency divider 520, logic circuit 424 receives divisor switching signal S_DS and S_CTRL_2(0) to S_CTRL_2(P−1) to change integer divisor $N_{D2}$. In the preferred embodiment, integer frequency divider 520 further comprises a phase adjusting circuit synchronizing divisor switching signal S_DS1 and output signal So1 generated by zipper frequency divider 310. The difference between integer frequency divider 530 and 320 is that integer frequency divider 530 receives S_CTRL_3(0) to S_CTRL_3(Q−1) to change integer divisor $N_{D3}$.

Note integer frequency divider 320 in FIG. 4 is only an example; a programmable integer frequency divider with a pulse/swallow counter may also be used in replacement of integer frequency divider 320. Since integer frequency divider with a pulse/swallow counter has the advantage of appropriate divisor range, the efficiency is degraded when combined with a zipper divider, thus integer frequency divider with fraction division functionality is a preferred choice.

Figure 6A:
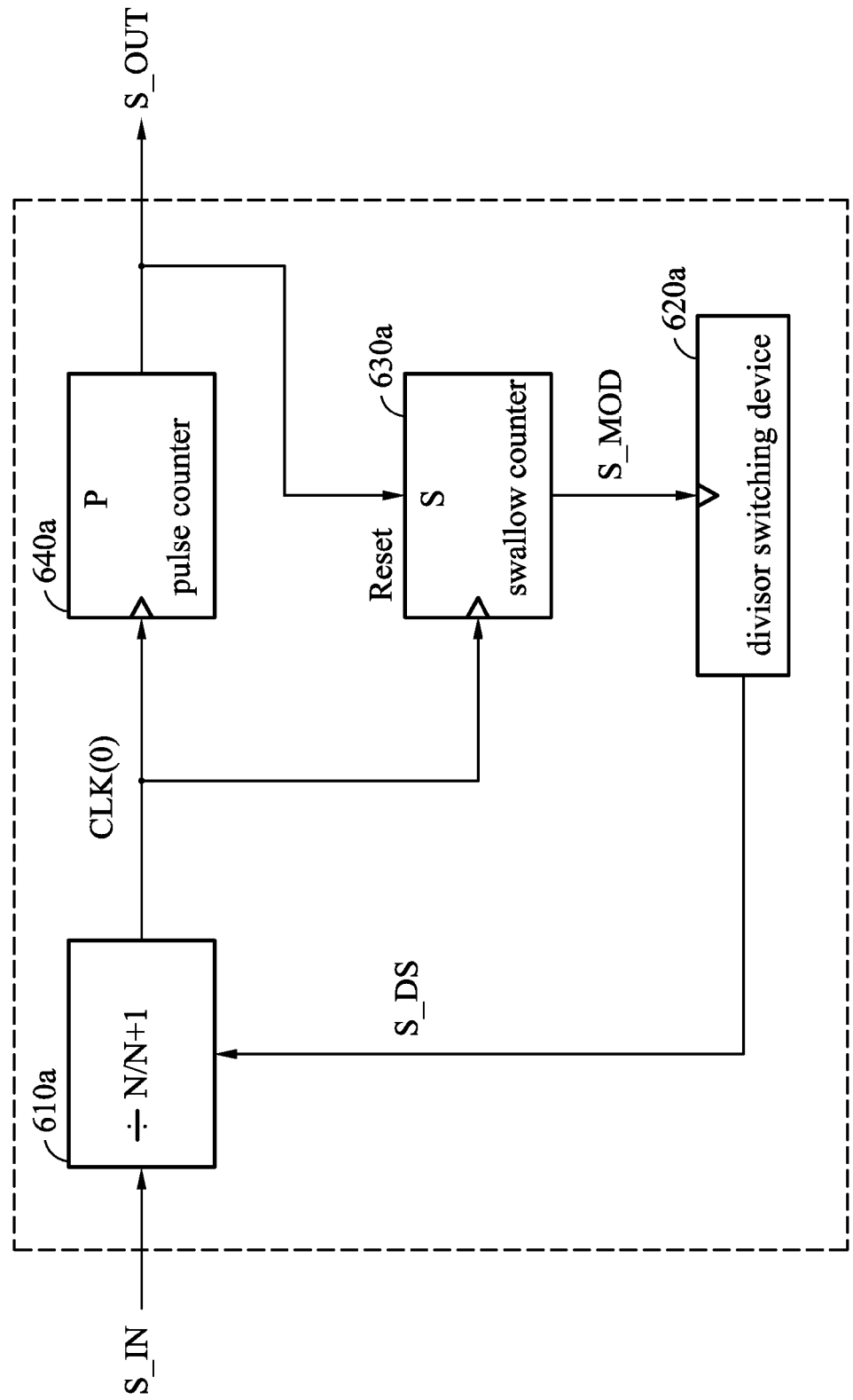
FIGS. 6a, b, and c are block diagrams of anther exemplary programmable integer and fraction frequency divider 100 in FIG. 1.

FIG. 6a is a block diagram of anther exemplary programmable integer and fraction frequency divider 100 in FIG. 1. As shown in FIG. 6a, fractional number switch 620a is added in between the output of swallow counter 630a and the input control terminal of dual-modulus frequency divider 610a. The operating principle of fractional number switch 620a was provided previously and the description thereof is omitted here for brevity.

Divisor Z of an integer frequency divider with a pulse/swallow counter may be represented by $Z=P \times N1+S$, where N1 and (N1+1) are the divisors generated by dual-modulus frequency divider 610a according to the divisor switching signal, S is an integer value of swallow counter 630a, and P is an integer value of 640a.

In one embodiment, when divisor switching signal S_DS is the first or second levels, the divisor of output signal S_OUT of 640a is integers $N_{S1}$ or $N_{S2}$. When divisor switching signal S_DS is the first level (high level), the overall divisor $N_{S1}$ of programmable integer and fraction frequency divider 100 is $N_{S1}=P \times N1$. When divisor switching signal S_DS is the second level (low level), the overall divisor $N_{S2}$ of programmable integer and fraction frequency divider 100 is $N_{S2}=P \times N1+S$. Therefore, when fractional number switch 620a sets the fractional number thereof as $1/N_P$, and the pulse width of divisor switching signal S_DS equals to that of swallow counter 630a, $Z=N_{S1}\times(N_P-1)/N_P+N_{S2}/N_P=P \times N1+S/N_P$.

Figure 6B:
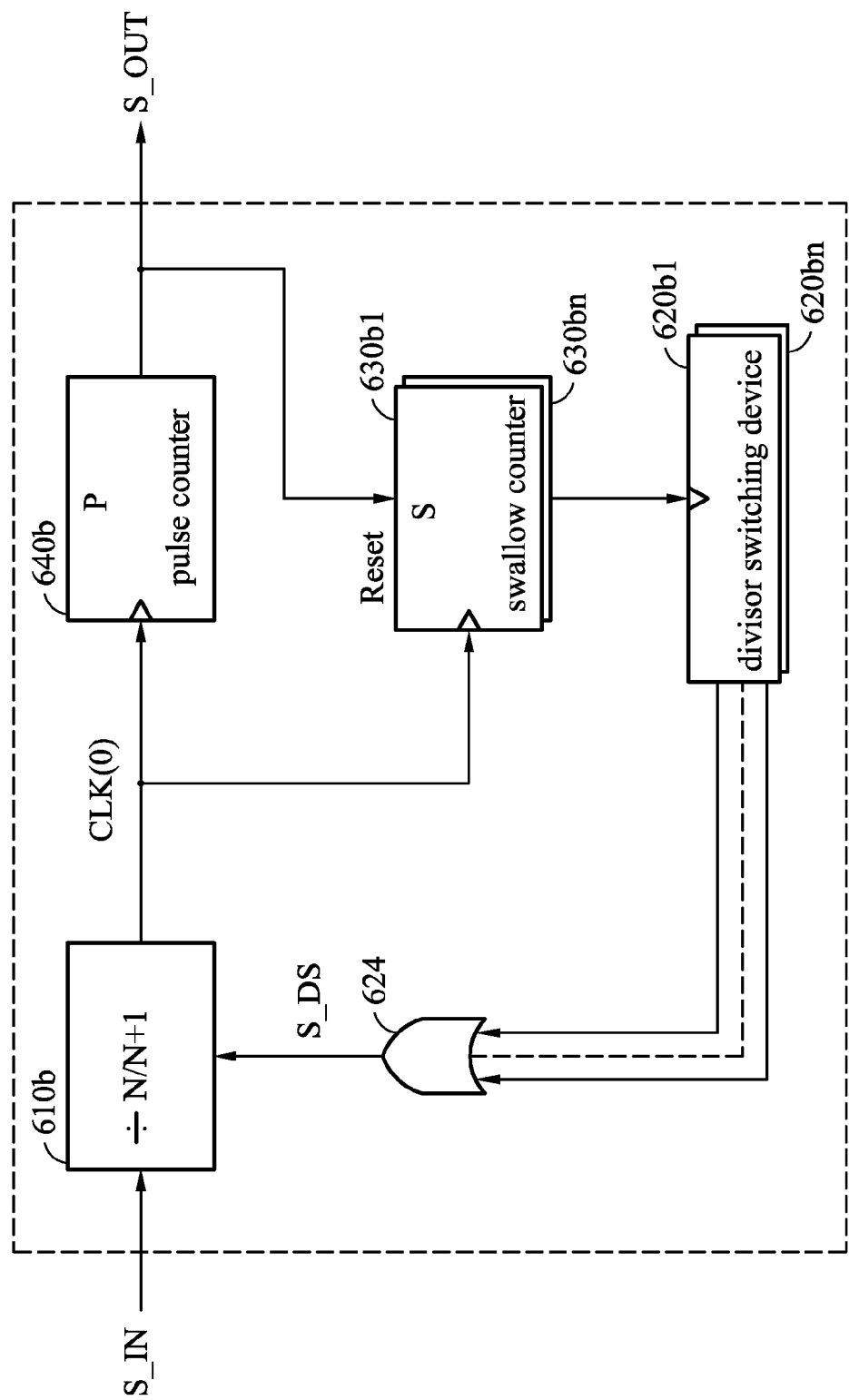
Figure 6C:
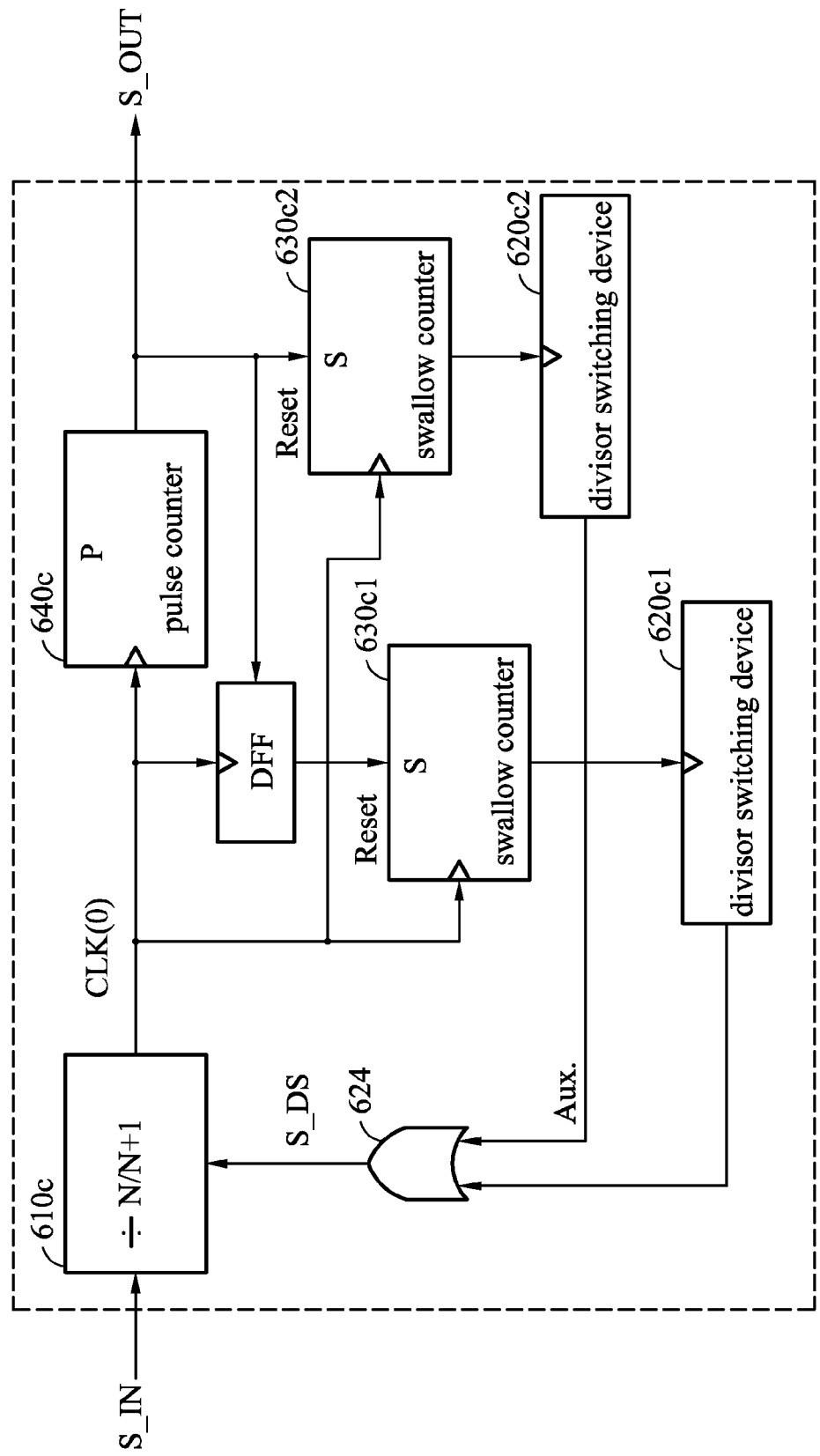

Note the integer frequency divider of the pulse/swallow counter has to satisfy $P \geq N1$ and $P \geq S$, thus S can be insufficient when serving as a fractional frequency divider, thus, FIGS. 6b and 6c are utilized instead. When reset signals of main and auxiliary swallow counters are synchronized, at least one auxiliary feedback circuit (swallow counter and fractional number switch) is required, the divisor of programmable integer and fraction frequency divider 100 is $Z=P \times N1+S_1/N_{P1}+\ldots+S_N/N_{PN}$, where $N_{P1}>\ldots>N_{PN}$ and $P \geq S_1 \ldots S_N$ (as shown in FIG. 6b). When reset signals of main and auxiliary swallow counters differ by a pulse width of the output signal of the dual-modulus divider, only one auxiliary feedback circuit is required, the divisor of programmable integer and fraction frequency divider 100 is $Z=P \times N1+S_1/N_{P1}+S_2/N_{P2}$, where $N_{P1}>N_{P2}$ and $P \geq S_1$ and $S_2$ (as shown in FIG. 6c).

In general, if $N_P=2^M$, when utilizing programmable integer frequency divider 110 with the pulse/swallow counter in the embodiment, divisor Z of programmable integer and fractional frequency divider is represented by:

$$Z=P \times N1+2^{-M1} \times S_1+\ldots+2^{-MN} \times S_N$$

Where $M1>\ldots>MN$, and $S_1$ to $S_N$ are all less or equal to P.

Figure 7:
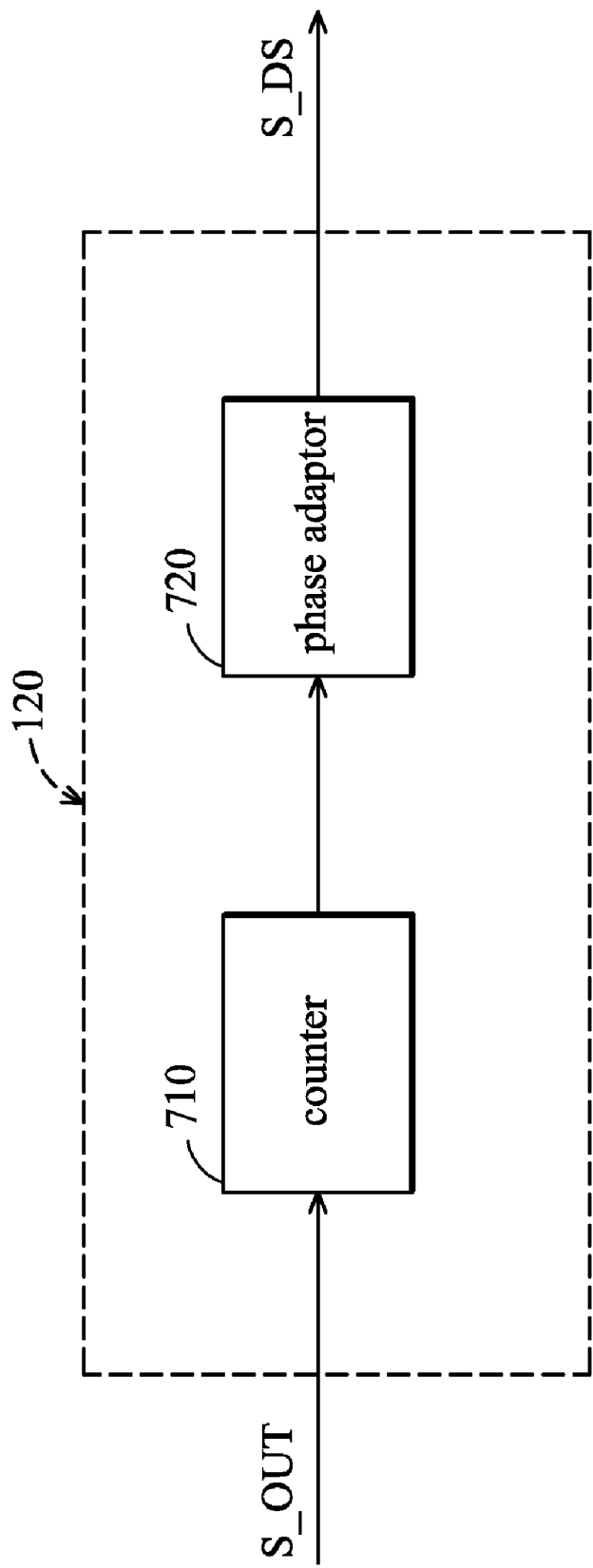
FIG. 7 is a block diagram of an exemplary fractional number switch 120.

FIG. 7 is a block diagram of an exemplary fractional number switch 120. As shown in FIG. 7, fractional number switch 120 comprises a counter 710 and a phase adaptor 720. The counter 710 receives the output signal S_OUT, calculates a pulse count of the output signal S_OUT, and generates divisor switching signal S_DS according the pulse count. The phase adaptor 720 adjusts the phase of divisor switching signal S_DS. When fractional number switch 120 is incorporated into the programmable integer frequency dividers in FIGS. 2, 3, 5, and 6, the phases of divisor switching signal S_DS is adjusted such that the phases of divisor switching signal S_DS is synchronized with the output signal of a front divider. Taking programmable integer frequency divider 110 in FIG. 2 as an example, the front divider may be, for example, dividing cell 210(2) when incorporating with a zipper divider, and dividing cell 610 when incorporating with a pulse/swallow divider.

Note the programmable integer and fractional frequency divider can comprise not only one single divisor switch, but also more than one divisor switches. Those with ordinary skill in the art can make modification to the circuitry wherever appropriate.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A programmable integer and fractional frequency divider, dividing a frequency of an input signal by a first divisor to generate an output signal, wherein the first divisor is an integer or a fraction, and the programmable integer and fractional frequency divider comprises:
    a dual-modulus divider, dividing the frequency of the output signal by a second divisor, wherein the second divisor is first or second integers according to a divisor switching signal;
    a programmable counter, calculating a pulse count of the output signal of the dual-modulus divider, and generating the output signal when the pulse count equals to a third integer;
    a swallow counter, calculating the pulse count of the output signal of the dual-modulus divider, switching a mode signal to a second level when the output signal equals to a fourth integer, and resetting the mode signal to a first level when the output signal is a predetermined level; and
    a fractional number switch, calculating a pulse count of the mode signal of the swallow counter, generating the divisor switching signal to switch a divisor of the dual-modulus divider when the pulse count of the mode signal equals to a predetermined pulse count, wherein the predetermined pulse count is determined by a fractional part of the first divisor, and the fractional number switch receives at least one fractional divisor control signal to change the predetermined pulse count, thereby changing the fractional part of the first divisor.

2. The programmable integer and fractional frequency divider of claim 1, wherein the fractional number switch is serially coupled between the swallow counter and the dual-modulus divider, the first and second integers are consecutive numbers, the third integer exceeds or equals to the first and fourth integer, and the first divisor is determined according to the first, third, and fourth integers, and the predetermined pulse count.

3. The programmable integer and fractional frequency divider of claim 2, wherein:
    $Z = P \times N1 + 2^{-M} \times S$, N1, P, S are the first, third, and fourth integers, respectively, M is an integer, $2^M/X$ is the predetermined pulse count; and
    X is the divisor switching signal such that a pulse width of the switching signal is equivalent to X times of a pulse width of the output signal.

4. The programmable integer and fractional frequency divider of claim 3, further comprising:
    at least one auxiliary swallow counter and auxiliary fractional number switch, setting a maximal value of the fourth integer of the swallow counter equal to the third integer of the programmable counter; and
    setting control signals of swallow counter, and at least one auxiliary swallow counter, and fractional number switch, and at least one auxiliary fractional number switch to be different integers to satisfy the consecutive range of the first divisor.

5. The programmable integer and fractional frequency divider of claim 4, wherein:
    $Z = P \times N1 + 2^{-M1} \times S_1 + 2^{-MN} \times S_N$, N1 is the first integer, P is the third integer, S1 to SN are the fourth integer sequence, M1 to MN are integer sequence, $M1 > \ldots > MN$ and $P \geq S_1 \ldots S_N$, and $2^{M1}/X$ to $2^{MN}/X$ are the predetermined pulse count sequence; and
    X is the divisor switching signal such that a pulse width of the switching signal is equivalent to X times a pulse width of the output signal.

6. The programmable integer and fractional frequency divider of claim 4, wherein the numbers of swallow counter and the at least one auxiliary swallow counter are i, when reset signals of the swallow counter and the at least one auxiliary swallow counter differ by a pulse width of the output signal of the dual-modulus divider, to satisfying the condition of the first divisor range being continuous.

7. The programmable integer and fractional frequency divider of claim 6, wherein:
    $Z = P \times N1 + 2^{-M1} \times S_1 + 2^{-M2} \times S_2$, N1 is the first integer, P is the third integer, $S_1$ and $S_2$ are the fourth integer sequence, M1 to M2 are integer sequence, $M1 > M2$ and $P \geq S_1$ and $S_2$, and $2^{M1}/X$ to $2^{M2}/X$ are the predetermined pulse count sequence; and X is the divisor switching signal such that a pulse width of the switching signal is equivalent to X times a pulse width of the output signal.

* * * * *